(12) United States Patent
Lin et al.

(10) Patent No.: US 8,594,958 B2
(45) Date of Patent: Nov. 26, 2013

(54) METHOD AND APPARATUS OF ELECTRICAL DEVICE CHARACTERIZATION

(75) Inventors: Kao-Cheng Lin, Taipei (TW); Yu-Te Kao, Kaohsiung (TW); Wen-Jung Liao, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 383 days.

(21) Appl. No.: 13/076,433

(22) Filed: Mar. 31, 2011

(65) Prior Publication Data

US 2012/0253719 A1 Oct. 4, 2012

(51) Int. Cl.
 *G06F 19/00* (2011.01)
(52) U.S. Cl.
 USPC .......................................................... 702/65
(58) Field of Classification Search
 USPC .......................................................... 702/65
 See application file for complete search history.

(56) References Cited

U.S. PATENT DOCUMENTS

| 7,408,372 | B2 | 8/2008 | Agarwal | |
|---|---|---|---|---|
| 8,072,811 | B2 * | 12/2011 | Lee et al. | 365/185.17 |
| 2008/0030220 | A1 | 2/2008 | Agarwal | |
| 2011/0110144 | A1 * | 5/2011 | Kawai et al. | 365/148 |

OTHER PUBLICATIONS

Agarwal, "Characterizing process variation in nanometer CMOS", p. 396-p. 399, Proceedings of the 44th annual Design Automation Conference 2007, 2007.

* cited by examiner

*Primary Examiner* — Bryan Bui
(74) *Attorney, Agent, or Firm* — Winston Hsu; Scott Margo

(57) ABSTRACT

A method of electrical device characterization comprises: providing an array of electrical devices arranged in rows and columns, wherein each electrical device has a first terminal, a second terminal and a third terminal; clamping a first voltage at a first terminal of a selected electrical device via a first buffer or an first external voltage source; clamping a second voltage at a second terminal of a selected electrical device via a second buffer or a second external voltage source; controlling a third buffer to couple the third terminal of the selected electrical device to a first terminal or a second terminal of at least one non-selected column of electrical devices; and deriving a characterization result via the third terminal of the selected electrical device; wherein the array of electrical devices, the first buffer, the second buffer and the third buffer are on a same die or a same module.

14 Claims, 7 Drawing Sheets

METHOD AND APPARATUS OF ELECTRICAL DEVICE CHARACTERIZATION

BACKGROUND OF THE INVENTION

1. Field of the Invention

The present invention relates to an electrical device characterization method and apparatus, and more particularly, to an electrical device characterization method and apparatus using a plurality of buffers for voltage clamping and minimizing leakage currents.

2. Description of the Prior Art

Semi-conductor products, such as mobile phones, computers, etc., find more and more applications as the technology advances, and microelectronic integrated circuits (ICs) are considered as one of the most significant semi-conductor elements. As the semi-conductor process scaling evolves with technology, process variation becomes much more crucial and hard to manipulate. For example, in sub-micron technology, lithographic variation, dopant variation, corner variation, temperature, etc., those minor variations all have great influence on device characterization.

Therefore, it is necessary to improve yield rate and verification process of electrical device fabricated in sub-micron semi-conductor processes. First of all, all electrical devices, for example, metal-oxide-semiconductor field effect transistors (MOSFETs), must be quickly examined and characterized, for example, the turn-on current and threshold voltages of the MOSFETs must be examined quickly and accurately to fulfill massive market requirements. To speed up electrical device characterization, those electrical devices are all lumped together into an array and tested automatically via a programmed computer system. However, since all devices are concentrated into an area, it is hard to avoid leakage current flowing through non-selected electrical devices, and those leakage currents would degrade the characterization result.

To alleviate the leakage current issue, some prior arts introduce on-chip circuitry to clamp voltages at drain terminals and gate terminals of an array of MOSFETs 1001, please refer to FIG. 1, which is a schematic diagram of a test structure 1000 of conventional characterization technology. The test structure 1000 in FIG. 1 utilizes test units 1100*a*, 1100*b*, 1100*c*, and 1100*d* for voltage driving, clamping or sensing at drain terminals and gate terminals of the MOSFETs 1001, and source terminals of the MOSFETs 1001 are sensed, sank and measured by MOSFET 1200*a* in conjunction with MOSFETs 1200*b*, 1200*c* and 1200*d*, respectively. The test units 1100*a*, 1100*b*, 1100*c*, and 1100*d* can be implemented by a plurality of MOSFET switches with multiplexing function, further details are omitted for brevity. By making use of those test units, a selected device under test (DUT) e.g., the MOSFETs 1001, can be fully driven while the gate terminals or the drain terminals of the other non-selected electrical devices are clamped with external voltage sources, and with the voltage clamping function, the leakage currents in the non-selected devices can be decreased, and so as the undesirable voltage drops appearing along the measuring routing lines. However, the test structure 1000 shown in FIG. 1 still requires a significant amount of time to measure a turn-on current and the threshold voltage of the DUT, i.e., the MOSFET 1001, since the voltages at the drain terminal and the gate terminal of the MOSFET 1001 must be calibrated via several iteration, in addition, the clamping voltages being forced to the non-selected devices are supplied externally, the gate terminals or the drain terminals of the non-selected electrical devices may be supplied with improper voltages leading to an incomplete isolation, and as a result, the clamping function may not be able to work as expected, the leakage current issue may still deteriorate the electrical device characterization results. Besides, the test structure 1000 shown in FIG. 1 is not suitable to integrated electrical devices of different dimensions into a same test region, when a DUT is being characterized, the gate terminals or the drain terminals of the non-selected electrical devices of different dimensions are clamped by a same external voltage; since electrical devices of different dimensions requires different turn-off condition, a single external voltage is insufficient to prevent leakage currents flowing through the non-selected electrical devices of different dimensions.

Therefore, traditional device characterization mechanism requires to be improved in consideration of leakage currents, characterization speed and measurement accuracy.

SUMMARY OF THE INVENTION

It is therefore one of the objectives of the present invention to improve electrical device characterization in consideration of accuracy and testing speed.

According to a first aspect of the present invention, a method of electrical device characterization id disclosed. The method includes: providing an array of electrical devices arranged in rows and columns, wherein each electrical device has a first terminal, a second terminal and a third terminal; clamping a first voltage at a first terminal of a selected electrical device via a first buffer or an first external voltage source; clamping a second voltage at a second terminal of a selected electrical device via a second buffer or a second external voltage source; controlling a third buffer to couple the third terminal of the selected electrical device to a first terminal or a second terminal of at least one non-selected column of electrical devices; and deriving a characterization result via the third terminal of the selected electrical device; wherein the array of electrical devices, the first buffer, the second buffer and the third buffer are on a same die or a same module.

According to a second aspect of the present invention, a machine readable medium storing program instructions for electrical device characterization of an array of electrical devices arranged in rows and columns is disclosed, and each electrical device has a first terminal, a second terminal and a third terminal, the program instructions performing following steps when executed by a processor: providing an array of electrical devices arranged in rows and columns, wherein each electrical device has a first terminal, a second terminal and a third terminal; clamping a first voltage at a first terminal of a selected electrical device via a first buffer or an first external voltage source; clamping a second voltage at a second terminal of a selected electrical device via a second buffer or a second external voltage source; controlling a third buffer to couple the third terminal of the selected electrical device to a first terminal or a second terminal of at least one non-selected column of electrical devices; and deriving a characterization result via the third terminal of the selected electrical device; wherein the array of electrical devices, the first buffer, the second buffer and the third buffer are on a same die or a same module.

The present invention provides a method and apparatus for electrical device characterization with buffers fabricated on a same chip or in a same module, electrical devices of one single dimension or different dimensions can be examined and characterized quickly and accurately in a large amount, in addition, during characterizing a selected electrical device, the non-selected electrical devices are turned off internally with those buffers such that leakage currents flowing through the non-selected electrical devices can be further minimized.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but in function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
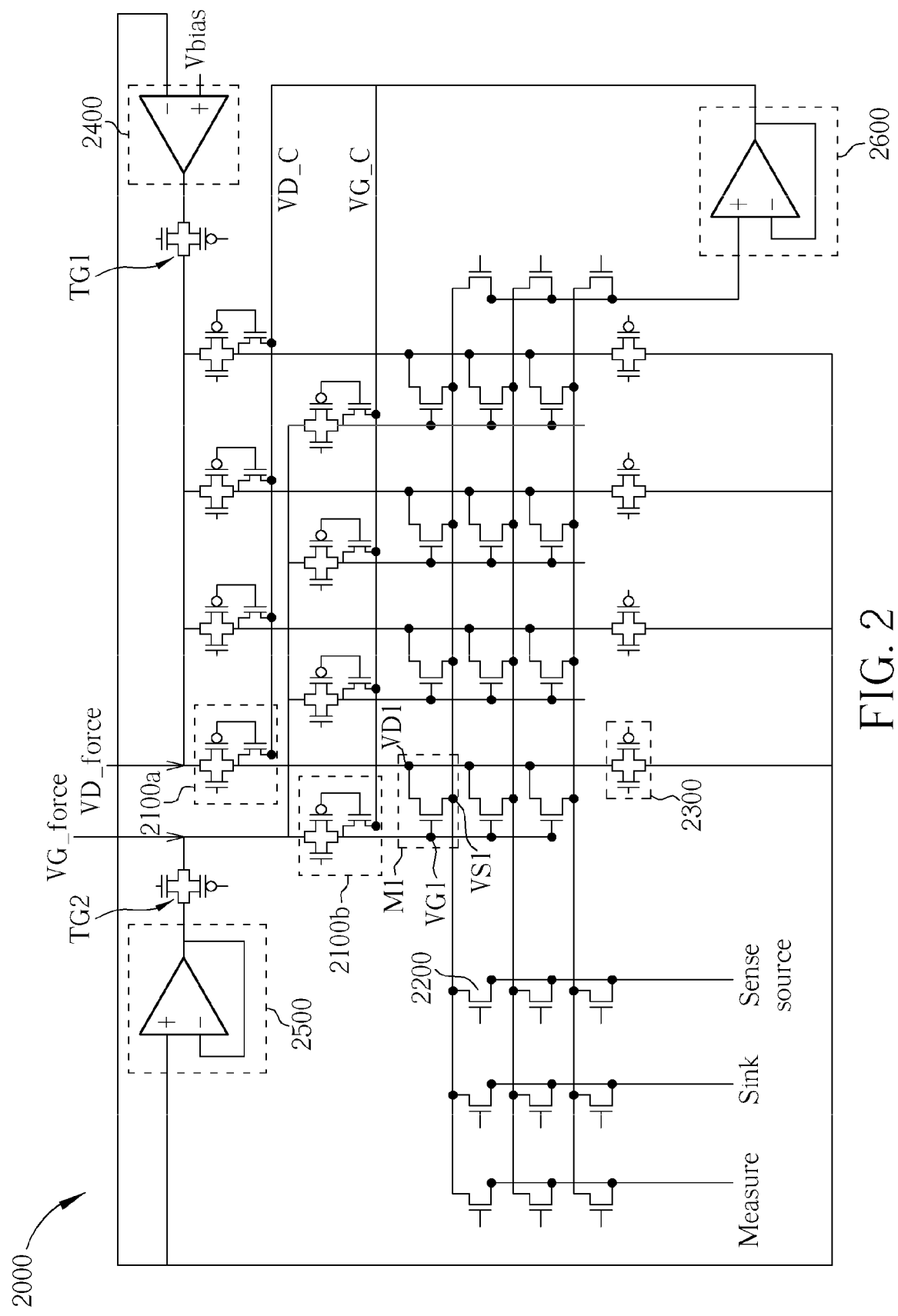
FIG. 2 is an exemplary diagram of a test structure of an array of electrical devices according to an embodiment of the present invention.

Please refer to FIG. 2, which is an exemplary diagram of a test structure 2000 of an array of electrical devices according to an embodiment of the present invention. The test structure 2000 includes (but is not limited to) an array of electrical device, e.g., metal-oxide-semiconductor field effect transistors (MOSFETs), arranged in rows and columns, a plurality of test units corresponding to the MOSFETs, a plurality of switches corresponding to the MOSFETs, a first buffer 2400, a second buffer 2500 and a third buffer 2600. Each electrical device of the test structure 2000 has a first terminal (e.g., a drain terminal), a second terminal (e.g., a gate terminal) and a third terminal (e.g., a source terminal). When a MOSFET M1 is selected as the device under test (DUT), a first voltage VD1 at the first terminal (i.e., the gate terminal) of the selected electrical device, i.e., MOSFET M1, is clamped via a first buffer 2400 or an first external voltage source VD_force, a second voltage VG1 at the second terminal (i.e., the gate terminal) of the MOSFET M1 is clamped via a second buffer 2500 or a second external voltage source VG_force, as shown in FIG. 2. Please note that each of the test units in this embodiment is implemented by a transmission gate and a MOSFET and operates as a switch to selective deliver a driving voltage from an external voltage source or a driving voltage from an internal buffer, however, this is not supposed to be a limitation to the present invention, the test units can also be realized by other circuit elements capable of multiplexing. The test unit 2100a and the test unit 2100b (which correspond to the drain terminal and the gate terminal of the MOSFET M1, respectively) are controlled to deliver driving voltages from buffers (the first buffer 2400, the second buffer 2500 and the third buffer 2600) or external voltage sources (the first external voltage source VD_force and the second external voltage source VG_force) to the drain terminal and the gate terminal, respectively, while the drain terminal and gate terminals of the other non-selected devices (i.e., all the MOSFETs except for the MOSFET M1) are clamped via the corresponding test units at predetermined voltages VD_C and VG_C, respectively.

Figure 1:
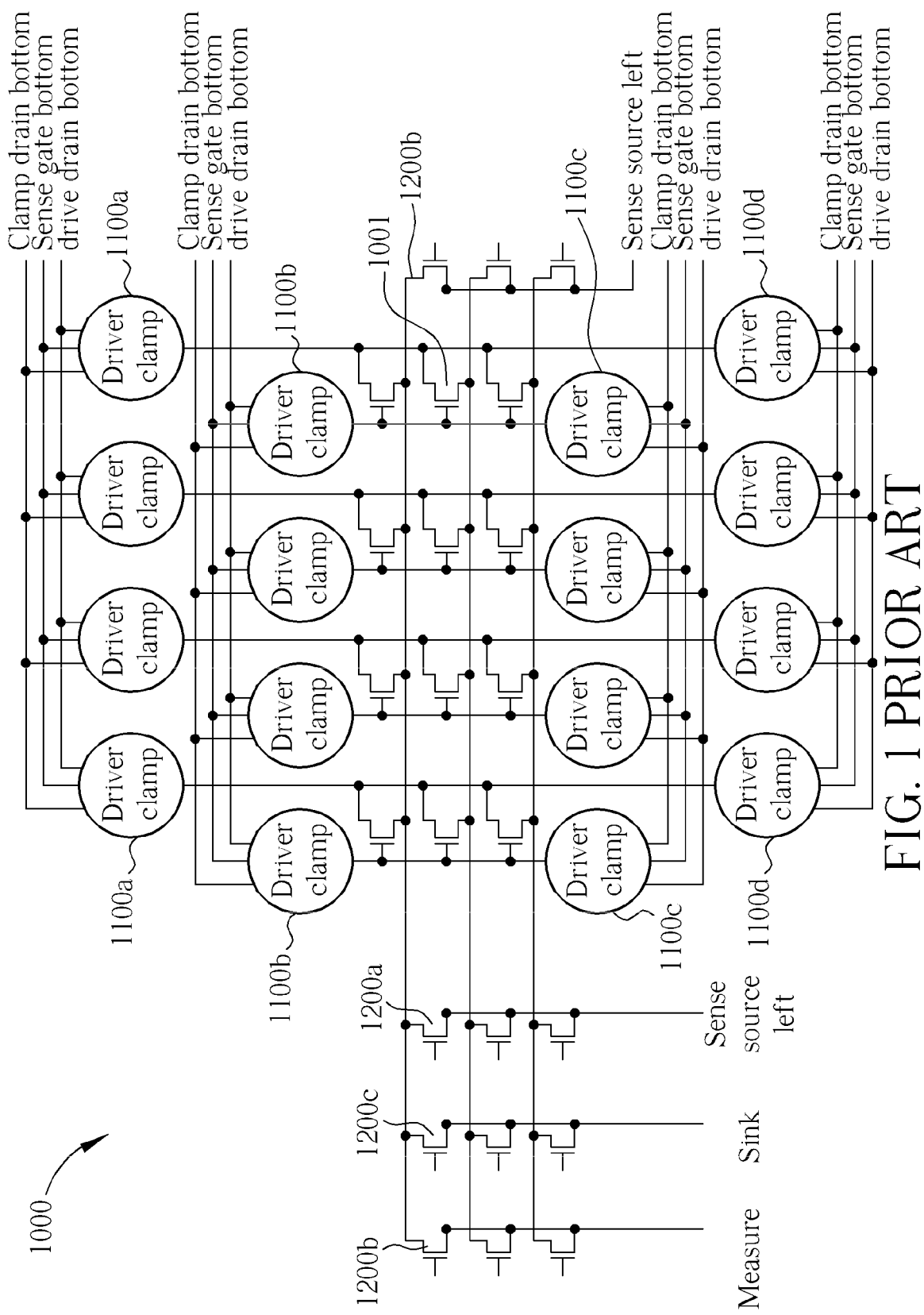
FIG. 1 is a schematic diagram of a test structure of conventional technology.

Please note that, unlike the test structure 1000 in FIG. 1, the source voltage VS of the MOSFET M1, which is not clamped by any circuit element, is further fed into the third buffer 2600, which operates as a unit gain buffer in this embodiment to output the source voltage VS of the MOSFET M1 as both the predetermined voltages VD_C and VG_C. Since the clamping voltages, i.e., the predetermined voltages VD_C and VG_C, are supplied internally within the test structure 1000, compared with conventional technique, those non-selected MOSEFTs are turned off with proper clamping voltages, the leakage currents flowing through the non-selected devices in the test structure 1000 during characterizing the MOSFET M1 can be further minimized, and therefore a more accurate characterization result can be derived. In this embodiment, each of the first buffer 2400, the second buffer 2500 and the third buffer 2600 is implemented by a unit gain buffer composed of an OP amplifier, however, this is not supposed to be a limitation to the present invention, the first buffer 2400, the second buffer 2500 and the third buffer 2600 can also be realized by other kinds of amplifier. In addition, the gains of the second buffer 2500 and the third buffer 2600 can be designed to be slightly different such that the non-selected MOSFETs are turned off more completely.

Figure 3:
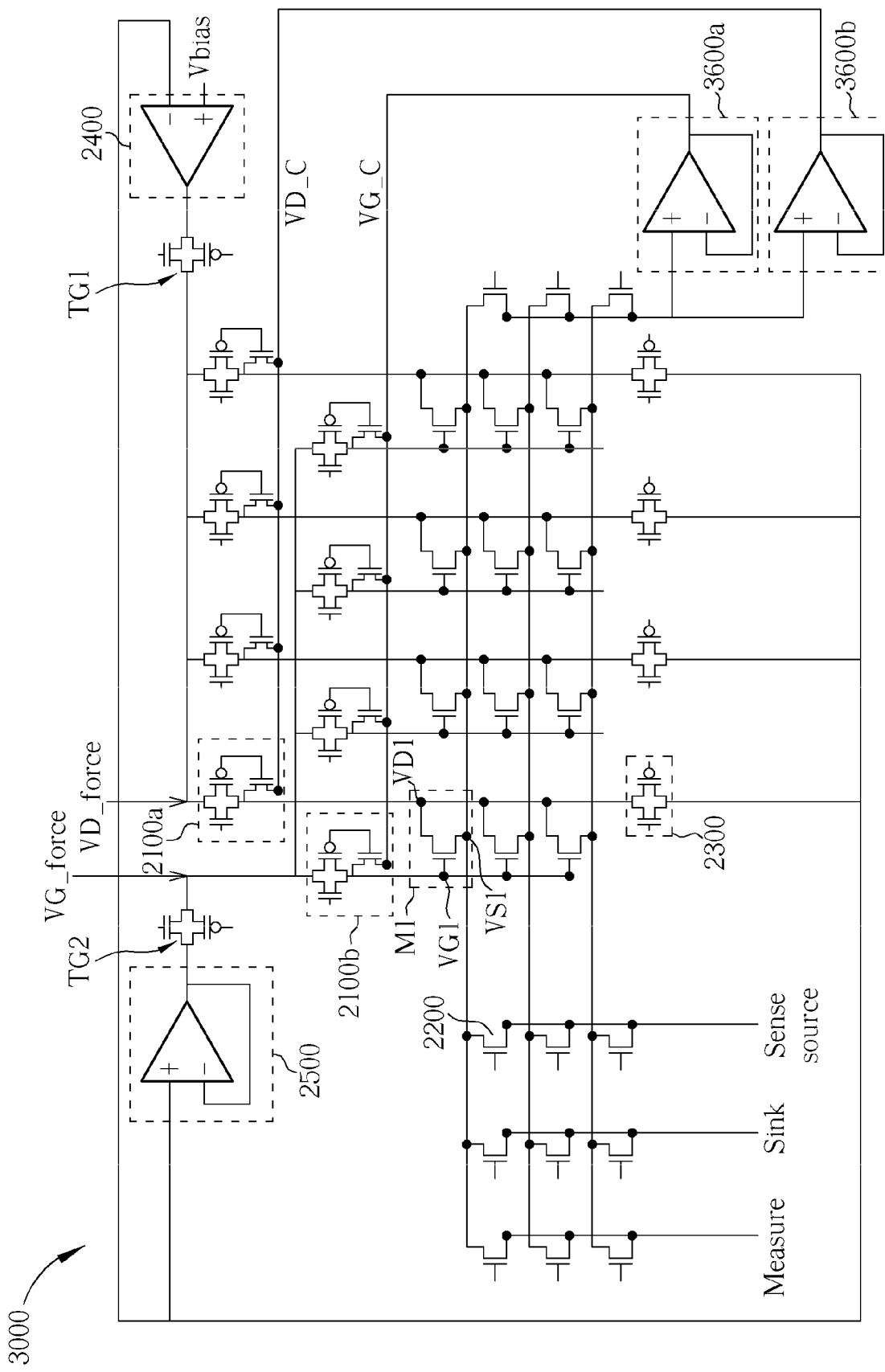
FIG. 3 is an exemplary diagram of a test structure of an array of electrical devices according to another embodiment of the present invention.

The test structure 2000 shown in FIG. 2 utilized a third buffer 2600 to feed the source voltage VS of the device under test (i.e., the MOSFET M1) into both the drain terminals and the gate terminals of the non-selected electrical devices, however, this is not supposed to be a limitation to the present invention, the third buffer 2600 can be used to clamp voltages at only the gate terminals of the non-selected electrical devices or only the drain terminals of the non-selected electrical devices, furthermore, the gate terminals of the non-selected electrical devices and the drain terminals of the non-selected electrical devices can also be clamped by two separate buffers in case that one single buffer is not sufficient to drive all non-selected MOSFETs. For example, please refer to FIG. 3, which is an exemplary diagram of a test structure 3000 of an array of electrical devices according to another embodiment of the present invention. Compared with the test structure 2000, the test structure 3000 utilizes a gate clamping buffer 3600a and a drain clamping buffer 3600b simultaneously, the gate clamping buffer 3600a is for delivering the buffered source voltage VS into the gate terminals of the non-selected electrical devices, and the drain clamping buffer 3600b is for delivering the buffered source voltage VS into the drain terminals of the non-selected electrical devices. In addition, since the drain terminal and gate terminal of each non-selected electrical device are clamped internally with a source voltage at its own source terminal, the non-selected electrical devices can be turned off completely no matter those non-selected electrical devices are of one single dimension or different dimensions. Therefore, the test structure 2000 shown in FIG. 2 can be fabricated with electrical devices of different dimensions with difficulty.

Figure 4:
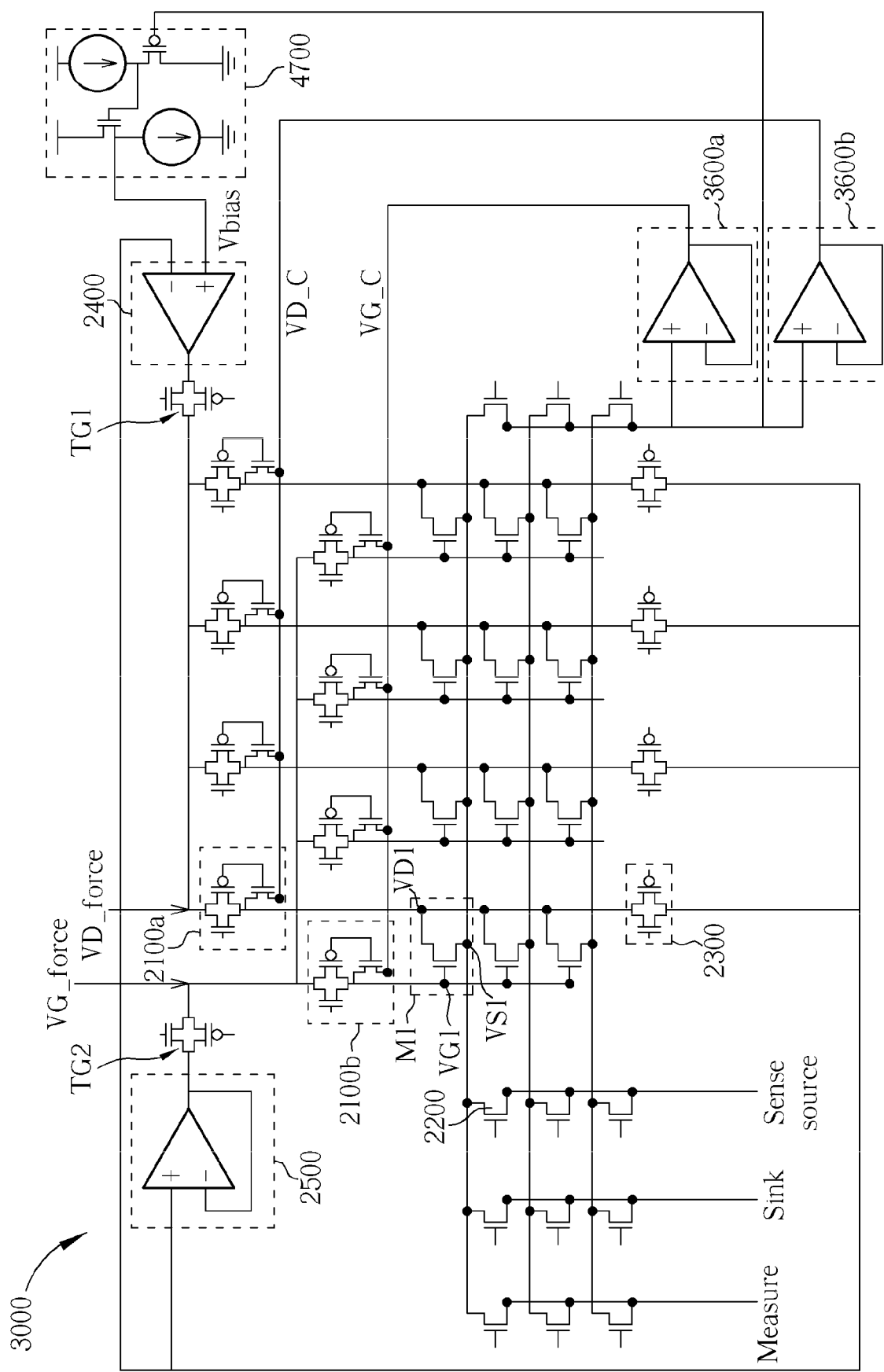
FIG. 4 is an exemplary diagram of a test structure of an array of electrical devices according to yet another embodiment of the present invention.

Please refer to FIG. 4 for more details of the present invention; FIG. 4 is an exemplary diagram of a test structure 4000 of an array of electrical devices according to yet another embodiment of the present invention. Compared with the test structure 3000 in FIG. 3, the test structure 4000 further includes a reference voltage generator 4700 for providing a bias voltage Vbias as an input to the first buffer 2400. In this exemplary embodiment, the reference voltage generator 4700 includes two stages of source followers, wherein one is a PMOS source follower and the other is an NMOS source follower and the two stages of source followers and the array of electrical devices are fabricated onto the same die or the same module. Since the reference voltage generator 4700 includes both the PMOS source follower and the NMOS source follower, it is capable of providing a wide variety of voltage values, such a circuit structure not only can be utilized for characterizing an N-type MOSFET, but also can generate negative a negative bias voltage Vbias for a P-type MOSFET characterization. Please note that, the reference voltage generator 4700 in FIG. 4 is merely for illustrative purpose, the bias voltage Vbias can be generated by multiple stages of source followers as long as the multiple stages of source followers comprise at least a PMOS source follower and an NMOS source follower.

Figure 5:
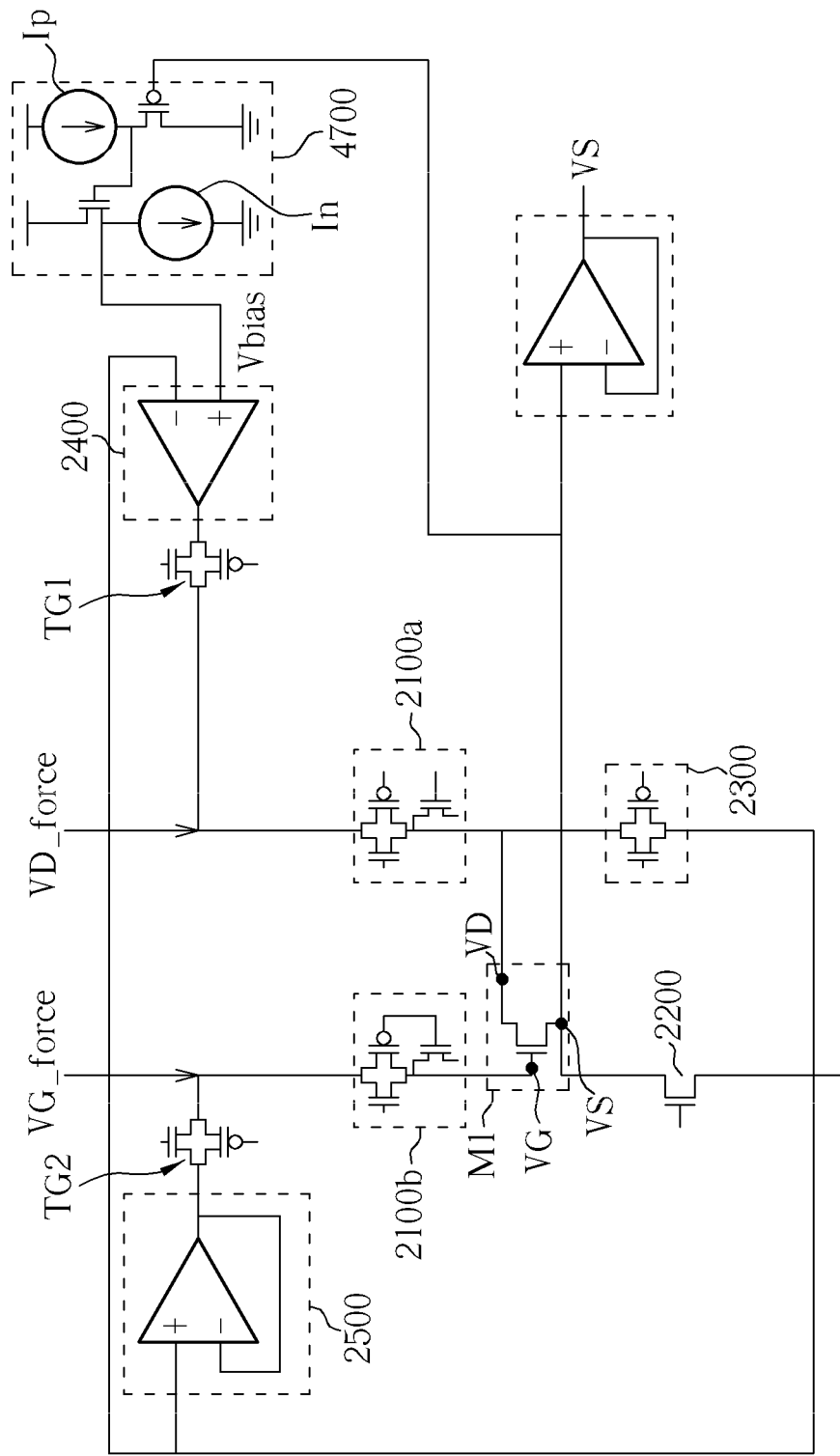
FIG. 5 is an exemplary diagram of characterizing an electrical device according to an embodiment of the present invention.
Figure 6:
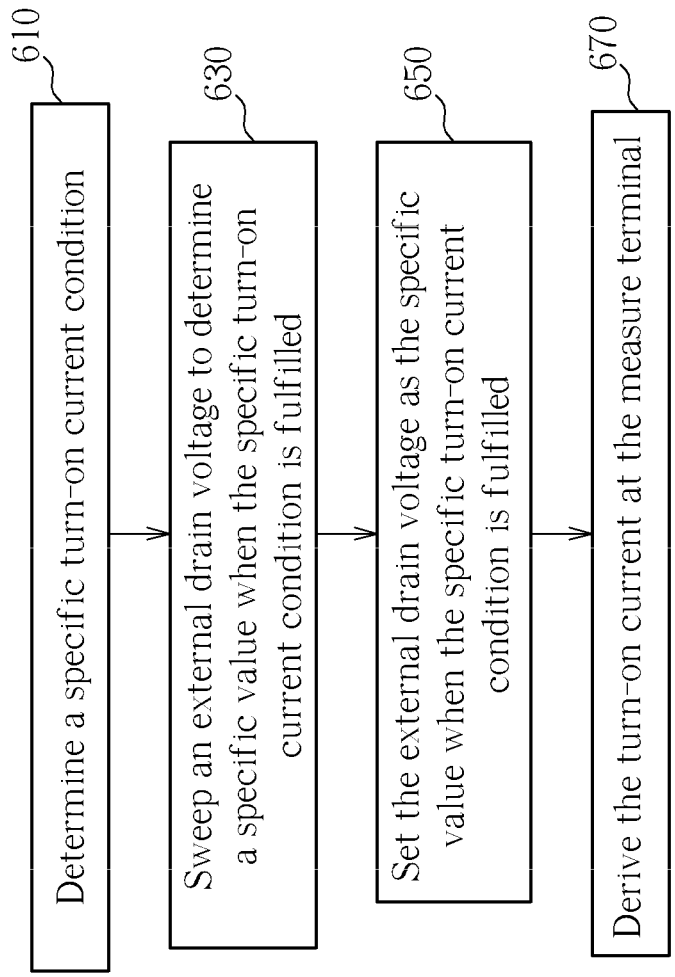
FIG. 6 is an exemplary flowchart of deriving a turn-on current of a electrical device according to an embodiment of the present invention.

Please refer to FIG. 5 in conjunction with FIG. 6 for operation details of the present invention; FIG. 5 is an exemplary diagram of characterizing the MOSFET M1 according to an embodiment of the present invention, certain circuit elements, for example, those non-selected MOSFETs and related elements, are omitted in FIG. 5 for succinctness. FIG. 6 is an exemplary flowchart of deriving a turn-on current Ion of the MOSFET M1 according to an embodiment of the present invention. When characterizing the turn-on current Ion of the MOSFET M1, the switching element TG1 is non-conducting such that the test unit 2100a is controlled to deliver an external drain voltage from the external voltage source VD_force, and the and switching element TG2 is conducting such that the test unit 2100b delivers a driving voltage from the second buffer 2500. In addition, a switching element 2300 is controlled to be conducting and transfer the drain voltage VD of the MOSFET M1 to an input of the second buffer 2500. Please note that since that the second buffer 2500 forces the gate voltage VG to track the drain voltage VD, in other words, the drain voltage VD and the gate voltage VG of the MOSFET M1 are forced to be identical.

If the result is substantially the same, the steps of deriving the turn-on current Ion of the MOSFET M1 are not required to be executed in the exact order shown in FIG. 6. In addition, the steps in FIG. 6 are not required to be executed sequentially, i.e., other steps can be inserted in between. The steps of deriving the turn-on current Ion of the MOSFET M1 are detailed as follows:

Step 610: determine a specific turn-on current condition;

Step 630: Sweep an external drain voltage to determine a specific drain voltage value when the specific turn-on current condition is fulfilled;

Step 650: set the external drain voltage as the specific value when the specific turn-on current condition is fulfilled;

Step 670: derive the turn-on current at the measure terminal.

In step 610, the specific turn-on current condition of this embodiment is determined as follows: VD−VS=VG−VS=1V, however, this is only for illustrative purpose only and is not supposed to be a limitation to the present invention. In step 630, measuring the source voltage VS and sweeping a driving voltage (the external drain voltage) to the first terminal (the drain terminal) of the selected electrical device, i.e., the MOSFET M1, via the first external voltage source VD_force to determine the predetermined voltage level, for example, when the first external voltage source VD_force delivers the driving voltage of 1.2V and the source voltage VS is measured as 0.2V, the predetermined voltage level is therefore determined as 1.2V. In step 650, setting the external drain voltage as predetermined voltage level when the specific turn-on current condition is fulfilled, i.e., VD−VS=VG−VS=1V. In step 670, deriving the turn-on current Ion at the measure terminal via a switching element 2200.

Figure 7:
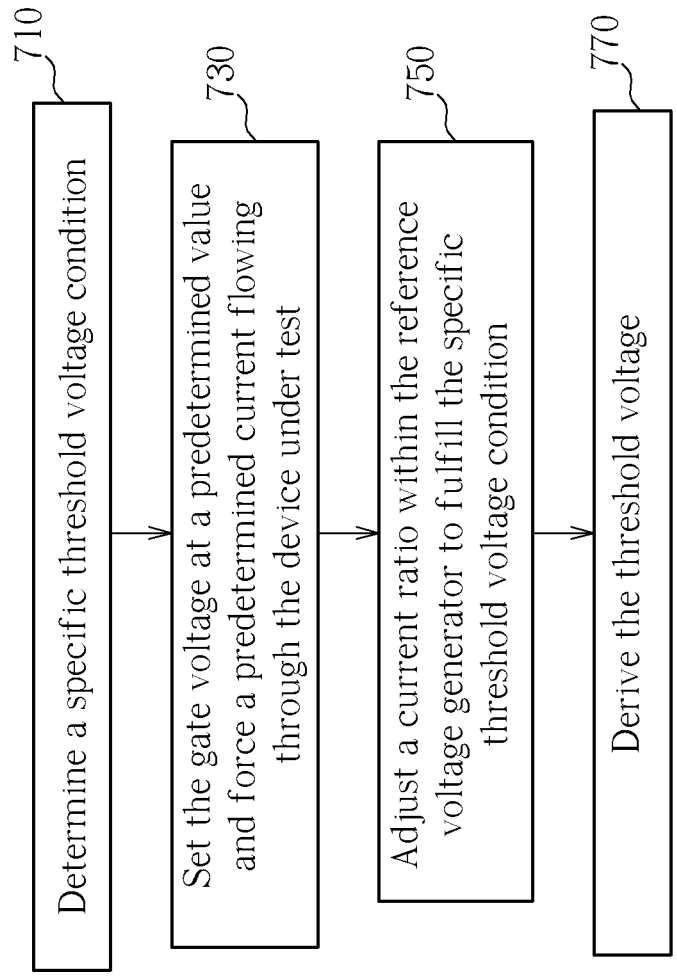
FIG. 7 is an exemplary flowchart of deriving a threshold of a electrical device according to an embodiment of the present invention.

Apart from characterizing the turn-on current, the test structures of the abovementioned embodiments can also be exploited for threshold voltage characterization. Please refer to FIG. 7 in conjunction with FIG. 5 for operation details of the present invention; FIG. 7 is an exemplary flowchart of deriving a threshold voltage of the MOSFET M1 according to an embodiment of the present invention. When characterizing the threshold Vth of the MOSFET M1, the switching element TG1 is conducting such that the test unit 2100a is controlled to deliver a driving voltage from the second buffer 2500, and the and switching element TG2 is non-conducting such that the test unit 2100b delivers an external drain voltage from the external voltage source VG_force. In addition, a switching element 2300 is controlled to be conducting and transfer the drain voltage VD of the MOSFET M1 to an input of the first buffer 2400, and the source voltage VS is fed into an input of the reference voltage generator 4700 as a dynamic bias voltage.

If the result is substantially the same, the steps of deriving the threshold Vth of the MOSFET M1 are not required to be executed in the exact order shown in FIG. 7. In addition, the steps in FIG. 7 are not required to be executed sequentially, i.e., other steps can be inserted in between. The steps of deriving the threshold Vth of the MOSFET M1 are detailed as follows:

Step 710: determine a specific threshold voltage condition

Step 730: set the gate voltage at a predetermined value and force a predetermined current flowing through the device under test;

Step 750: adjust a current ratio within the reference voltage generator to fulfill the specific saturation voltage condition;

Step 770: derive the threshold voltage.

In this embodiment, the step 710 is designed to characterizing the threshold voltage of the MOSFET M1 when in saturation, the specific threshold voltage condition of this embodiment is determined as follows: VD−VS=1V and a bias current=$I_{SAT}$. In step 730, the gate voltage VG of the MOSFET M1 is set at a predetermined value, e.g., VG=1V, via the second external voltage source VG_force, and a predetermined current of $I_{SAT}$ is forced to flow through the MOSFET M1 via switching element 2200. In step 750, the source voltage VS is measured and a current ratio Ip/In within the reference voltage generator 4700 is adjusted such that the specific saturation voltage condition VD−VS=1V is fulfilled. Finally in step 770, the threshold voltage Vth in saturation is derived by a difference between the gate voltage VG and the source voltage VS, Vth=VG−VS. Please note that the above-mentioned embodiment demonstrates a characterization of the saturation threshold voltage of an electrical device, nevertheless, a similar processing flow can be adopted to characterize a threshold voltage of an electrical device in linear region with a corresponding modification to the specific threshold voltage condition. These kinds of design variation are also fall within the scope of the present invention.

The test structures and characterization method are only preferred embodiments of the present invention, and those are not supposed to be limitations to the present invention. For example, the present invention also provides machine readable medium storing program instructions for electrical device characterization of an array of electrical devices arranged in rows and columns, and the program instructions can be executed by a processor to perform the characterization processes without difficulty. Those kinds of variation in design also fall within the scope of the present invention.

In summary, the present invention provides a method and apparatus for electrical device characterization, with the help of buffers fabricated on a same chip or in a same module, the electrical devices of one single dimension or different dimensions can be examined and characterized quickly and accurately in a large amount, in addition, during characterizing a selected electrical device, the non-selected electrical devices are turned off internally with those buffers such that leakage currents flowing through the non-selected electrical devices can be further minimized. Besides, since each electrical device is dynamically biased with internal voltages, all of the electrical devices on a same die can be designed to have different dimensions without difficulty.

Those skilled in the art will readily observe that numerous modifications and alterations of the device and method may be made while retaining the teachings of the invention.

What is claimed is:

1. A method of electrical device characterization, comprising:
   providing an array of electrical devices arranged in rows and columns, wherein each electrical device has a first terminal, a second terminal and a third terminal;
   clamping a first voltage at a first terminal of a selected electrical device via a first buffer or an first external voltage source;
   clamping a second voltage at a second terminal of a selected electrical device via a second buffer or a second external voltage source;
   controlling a third buffer to couple the third terminal of the selected electrical device to a first terminal or a second terminal of at least one non-selected column of electrical devices; and
   deriving a characterization result via measuring at least one of a current and a voltage of the third terminal of the selected electrical device;
   wherein the array of electrical devices, the first buffer, the second buffer and the third buffer are on a same die or a same module.

2. The method of claim 1, wherein the electrical devices are of different dimensions.

3. The method of claim 1, wherein each electrical device is a metal-oxide-semiconductor (MOS) transistor, the first terminal is a drain terminal, the second terminal is a gate terminal and the third terminal is a source terminal.

4. The method of claim 1, wherein the step of clamping the first voltage at the first terminal of the selected electrical device via the first buffer or the first external voltage source comprises:
   providing multiple stages of source followers to generate a bias voltage; and
   clamping the first voltage at the first terminal of the selected electrical device via the first buffer according to the bias voltage;
   wherein the multiple stages of source followers comprise at least a PMOS source follower and an NMOS source follower, and the multiple stages of source followers and the array of electrical devices are fabricated onto the same die or the same module.

5. The method of claim 1, wherein the step of deriving a characterization result via the third terminal of the selected electrical device comprises:
   conducting a predetermined current via the selected electrical device;
   adjusting a voltage difference between the first terminal and the third terminal of the selected electrical device to a predetermined voltage level;
   sensing a third voltage at the third terminal of the selected electrical device; and
   deriving a voltage difference between the second terminal and the third terminal as the characterization result.

6. The method of claim 1, wherein the first buffer and the second buffer are configured to clamp the first voltage of the first terminal and the second voltage of the second terminal of the selected electrical device at a same predetermined voltage level.

7. The method of claim 6, wherein the step of deriving a characterization result via the third terminal of the selected electrical device comprises:
   sweeping a driving voltage to the first terminal of the selected electrical device via the first external voltage source to determine the predetermined voltage level; and
   deriving a target current as the characterization result via the third terminal of the selected electrical device when the first voltage of the first terminal and the second voltage of the second terminal of the selected electrical device are both at the predetermined voltage level.

8. A non-transitory machine readable medium storing program instructions for electrical device characterization of an array of electrical devices arranged in rows and columns wherein each electrical device has a first terminal, a second terminal and a third terminal, the program instructions performing following steps when executed by a processor:
   clamping a first voltage at a first terminal of a selected electrical device via a first buffer or an first external voltage source;
   clamping a second voltage at a second terminal of a selected electrical device via a second buffer or a second external voltage source;
   controlling the third buffer to couple the third terminal of the selected electrical device to a first terminal or a second terminal of at least one non-selected column of electrical devices, wherein the at least one non-selected column is different from the selected column; and
   deriving a characterization result via measuring at least one of a current and a voltage of the third terminal of the selected electrical device;
   wherein the array of electrical devices, the first buffer, the second buffer and the third buffer are on a same die or a same module.

9. The machine readable medium of claim 8, wherein the electrical devices are of different dimensions.

10. The machine readable medium of claim 8, wherein each electrical device is a metal-oxide-semiconductor (MOS) transistor, the first terminal is a drain terminal, the second terminal is a gate terminal and the third terminal is a source terminal.

11. The machine readable medium of claim 8, wherein clamping the first voltage at the first terminal of the selected electrical device via the first buffer or the first external voltage source comprises:

clamping the first voltage at the first terminal of the selected electrical device according to a bias voltage generated by multiple stages of source followers;

wherein the multiple stages of source followers comprise at least a PMOS source follower and an NMOS source follower, and the multiple stages of source followers and the array of electrical devices are fabricated onto the same die or the same module.

12. The machine readable medium of claim 8, wherein deriving a characterization result via the third terminal of the selected electrical device comprises:

conducting a predetermined current via the selected electrical device;

adjusting a voltage difference between the first terminal and the third terminal of the selected electrical device to a predetermined voltage level;

sensing a third voltage at the third terminal of the selected electrical device; and deriving a voltage difference between the second terminal and the third terminal as the characterization result.

13. The machine readable medium of claim 8, wherein the first buffer and the second buffer are configured by the program instructions executed by the processor to clamp the first voltage of the first terminal and the second voltage of the second terminal of the selected electrical device at a same predetermined voltage level.

14. The machine readable medium of claim 13, wherein deriving a characterization result via the third terminal of the selected electrical device comprises:

sweeping a driving voltage to the first terminal of the selected electrical device via the first external voltage source to determine the predetermined voltage level; and deriving a target current as the characterization result via the third terminal of the selected electrical device when the first voltage of the first terminal and the second voltage of the second terminal of the selected electrical device are both at the predetermined voltage level.

* * * * *